United States Patent
Sekimoto

(10) Patent No.: US 6,229,403 B1
(45) Date of Patent: May 8, 2001

(54) VOLTAGE-CONTROLLED OSCILLATOR

(75) Inventor: Yasuhiko Sekimoto, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 09/362,469

(22) Filed: Jul. 28, 1999

(30) Foreign Application Priority Data

Aug. 6, 1998  (JP) ................................................. 10-223360

(51) Int. Cl.[7] ................................................. H03B 27/00
(52) U.S. Cl. ............................................. 331/57; 327/103
(58) Field of Search ............................... 331/57; 327/103

(56) References Cited

U.S. PATENT DOCUMENTS

| | | | |
|---|---|---|---|
| 5,180,995 | * 1/1993 | Hayashi et al. | 331/57 |
| 5,465,063 | * 11/1995 | Fukuda et al. | 327/512 |
| 5,748,048 | * 5/1998 | Moyal | 331/34 |
| 5,764,110 | * 6/1998 | Ishibashi | 331/57 |
| 6,104,254 | * 8/2000 | Iravani | 331/57 |

FOREIGN PATENT DOCUMENTS

| | | |
|---|---|---|
| 6-21776 | 1/1994 | (JP) . |
| 8-23266 | 1/1996 | (JP) . |

OTHER PUBLICATIONS

Howard C. Yang, et al., "A Low Jitter 0.3–165 MHz CMOS PLL Frequency Synthesizer for 3 V/5 Operation", IEEE Journal of Solid–State Circuit, vol. 32, No. 4, Apr. 1997, pp. 582–587.

* cited by examiner

Primary Examiner—Benny Lee
Assistant Examiner—Henry Choe
(74) Attorney, Agent, or Firm—Morrison & Foerster

(57) ABSTRACT

A voltage-controlled oscillator is provided which has input and output characteristics that do not depend upon fluctuations or variations in the power supply voltage, operating temperature, and manufacturing process, and which provides a high oscillation frequency. A ring oscillator comprises a plurality of inverters that are connected in a ring-like arrangement. A voltage-current converter controls an amount of current flowing through each of the inverters of the ring oscillator according to a voltage of an input signal. The voltage-current converter comprises a first transistor (P101) that is connected to a power supply line and disposed such that current corresponding to the voltage of the input signal flows through the first transistor. Each of the inverters of the ring oscillator has a second transistor (P103) that is connected to the power supply line and forms a current mirror circuit with the first transistor. The second transistor is biased so that it operates at a boundary between a saturation region and a non-saturation region.

5 Claims, 5 Drawing Sheets

VOLTAGE-CONTROLLED OSCILLATOR

BACKGROUND OF THE INVENTION

1. Field of the Invention

The present invention relates to a voltage-controlled oscillator which has excellent input and output characteristics that do not depend upon fluctuations or variations in the power supply voltage, temperature, manufacturing process and others, and which provides a high oscillation frequency.

2. Prior Art

Various types of voltage-controlled oscillators (VCO) are known which are adapted to oscillate at an oscillation frequency that varies with input voltage. Among these, ring oscillator type VCO is constructed such that a plurality of inverters are connected in a ring-like arrangement, and thus favorably used in digital circuits.

FIG. 1 shows the configuration of a known voltage-controlled oscillator. The voltage-controlled oscillator VCO is principally comprised of a V-I converter 1 and a ring oscillator 2, and has a control input terminal CONT to which a control signal CS is supplied.

The V-I converter 1 serves to convert the voltage level Vin of the control signal CS into a corresponding current value. As shown in FIG. 1, the V-I converter 1 includes an op amp (operational amplifier) OP, a p-channel transistor P1, a resistance R connected in series with the p-channel transistor P1, a p-channel transistor P2, and an n-channel transistor N1 connected in series with the p-channel transistor P2. The gate of the p-channel transistor P1 is connected to the output terminal of the op amp OP, and the drain of the same transistor P1 is connected to the positive input terminal of the op amp OP. The gates of the p-channel transistors P1, P2 are connected to each other (namely, the p-channel transistors P1, P2 have a common gate), so that the p-channel transistor P2 forms a current mirror circuit with the p-channel transistor P1. The gate and drain of the n-channel transistor N1 are connected to each other, namely, the n-channel transistor N1 is of diode-connected type. With this arrangement, the drain voltage Vr of the p-channel transistor P1 is applied to the positive input terminal of the op amp OP in a feedback manner, so that the voltage Vr is controlled to be constantly equal to the input voltage Vin. Accordingly, current i1 flowing through the p-channel transistor P1 is given by the following equation (1):

$$i1=Vr/R=Vin/R \tag{1}$$

It will be understood from the above equation (1) that the current i1 only depends upon the voltage Vin, and does not depend at all upon fluctuations or variations in the power supply voltage, operating temperature, and the manufacturing process. In this example, the device size of the p-channel transistor P1 is set to be equal to that of the p-channel transistor P2. Since these transistors P1, P2 form a current mirror circuit, the current i1 is equal to current i2 flowing through the p-channel transistor P2.

The voltage Vp and voltage Vn that appear in the V-I converter 1 are then supplied to the ring oscillator 2. The ring oscillator 2 is constructed as a series connection of a plurality of inverters. The device size of p-channel transistors P3–Pn+1 of these inverters is set to be equal to that of the p-channel transistors P1, P2 of the V-I converter 1, and the device size of n-channel transistors N2–Nn is set to be equal to that of the n-channel transistor N1 of the V-I converter 1. The p-channel transistors P3, P5, . . . Pn on the side of the positive power supply form a current mirror circuit with the p-channel transistors P1, P2 of the V-I converter 1, and the n-channel transistors N3, N5, . . . Nn on the ground side also form a current mirror circuit with the n-channel transistor n1 of the V-I converter 1. Thus, the current flowing through each inverter is equal to the current i1.

Generally, the delay time T of each inverter is represented by: T=CV/i, where C represents the gate is capacitance of transistors of the next stage inverter, and V represents the supply voltage. If the ring oscillator is formed of n-stage inverters, therefore, the oscillation frequency f of the voltage-controlled oscillator VCO is approximately calculated according to the following equation (2):

$$f=n \cdot 1/CV=n \cdot Vin/(CV \cdot R) \tag{2}$$

It will be understood from the above equation (2) that the oscillation frequency f does not depend on variations in the operating temperature or manufacturing process, but depends on the voltage Vin.

In the actual operation of the voltage-controlled oscillator VCO constructed as described above, however, the current flowing through each inverter needs to be set to be smaller than the current i1 in view of the relationship with the amplitude of the signal. This point will be described in further detail taking the first-stage inverter as an example.

FIG. 2 shows the configuration of the inverter in the first stage of the ring oscillator 2. FIG. 3 shows the waveform of the signal voltage V that is the drain voltage of the p-channel transistor P4. As shown in FIG. 3, the signal voltage V exceeds the drain voltage of the p-channel transistor P1 during a period of time T1, and falls below the drain voltage of the n-channel transistor N1 during a period of time T2. During these periods T1, T2, therefore, the voltage VDS between the drain and source of each of the p-channel transistor P3 and the n-channel transistor N3 is reduced to a low value. FIG. 4 shows a general relationship between the drain-source voltage VDS and the drain current id. In FIG. 4 in which VDS1 denotes the voltage between the drain and source of the p-channel transistor P1 and VDS3 denotes the voltage between the drain and source of the p-channel transistor P3, the drain-source voltage VDS1 is located in the saturation region and the drain-source voltage VDS 3 is located in the non-saturation region as shown in FIG. 4, with the result that the current i1 becomes larger than the current i3. Since the oscillation frequency f is proportional to the current i flowing through each inverter according to the above expression (2), the known voltage-controlled oscillator VCO suffers from a problem that the oscillation frequency f is reduced due to the reduced current i3.

To avoid the above problem, a voltage-controlled oscillator as shown in FIG. 5 is proposed in "A Low Jitter 0.3–165 MHz CMOS PLL Frequency Synthesizer for 3V/5V Operation" IEEE J. Solid-State Circuits vol. 32, No. 4, April 1997 p.582–586.

In the voltage-controlled oscillator VCO of FIG. 5, a control signal CS is supplied to each gate of n-channel transistors N10, N20 via a control input terminal CONT. If all of p-channel transistors P10–P90 have the same device size, the voltage Vp1 between the positive power supply voltage (source) and the gate of the p-channel transistor P40 is smaller than the voltage Vp2 between the power supply voltage and the gate of the p-channel transistor P50 (namely, Vp1<Vp2). Also, the same current flows through the p-channel transistor P40, P50 having the same device size, and therefore Vp1 is obtained by subtracting nA from Vp2, i.e., Vp1=Vp2−nA, where nA is the source-drain voltage of the p-channel transistor 40.

Accordingly, the source-drain voltage nA of the p-channel transistor P40 on the side of the positive power supply is equal to Vp2–Vp1, thus eliminating the above problem encountered in the circuit of FIG. 1 that the drain-source voltage is reduced with the result of restricted or reduced current.

In the voltage-controlled oscillator VCO as shown in FIG. 5, however, the voltage Vp1 and voltage Vp2 depend on fluctuations or variations in the power supply voltage, operating temperature, and/or the manufacturing process, as well as the input voltage Vin. Thus, the known voltage-controlled oscillator VCO suffers from variations or changes in the relationships of the oscillation frequency f with the input voltage Vin.

SUMMARY OF THE INVENTION

It is therefore an object of the present invention to provide a voltage-controlled oscillator which has input and output characteristics that do not depend upon fluctuations or variations in the power supply voltage, operating temperature, and manufacturing process, and which provides a high oscillation frequency.

To attain the above object, the present invention provides a voltage-controlled oscillator comprising a ring oscillator comprising a plurality of inverters that are connected in a ring-like arrangement, a voltage-current converter that controls an amount of current flowing through each of the inverters of the ring oscillator according to a voltage of an input signal, wherein the voltage-current converter comprises a first transistor (P101) that is connected to a power supply line and disposed such that current corresponding to the voltage of the input signal flows through the first transistor, each of the inverters of the ring oscillator having a second transistor (P103) that is connected to the power supply line and forms a current mirror circuit with the first transistor, and biasing means for biasing the second transistor so that the second transistor operates at a boundary between a saturation region and a non-saturation region.

In a preferred form of the present invention, the voltage-controlled oscillator comprises a ring oscillator comprising a plurality of inverters that are connected in a ring-like arrangement, and a voltage-current converter that controls an amount of current flowing through each of the inverters of the ring oscillator according to a voltage of an input signal, wherein the voltage-current converter comprises a first transistor (P101) and a second transistor (P102; P103') having a gate, each of the first transistor and the second transistor being connected to a power supply line and disposed such that current corresponding to the voltage of the input signal flows through each of the first transistor and the second transistor, wherein each of the inverters of the ring oscillator comprises a third transistor (P103) that is connected to the power supply line, and forms a current mirror circuit with the first transistor, and a fourth transistor (P104) that is connected in series with the third transistor and has a gate connected to the gate of the second transistor, the fourth transistor supplying current to other devices that constitute the each inverter, and wherein the first transistor, the third transistor and the fourth transistor have substantially the same device size, and the second transistor has a device size that is one-fourth of that of the first transistor.

In a first preferred embodiment of the present invention, the voltage-controlled oscillator comprises a ring oscillator comprising a plurality of inverters that are connected in a ring-like arrangement, and a voltage-current converter that controls an amount of current flowing through each of the inverters of the ring oscillator according to a voltage of an input signal, wherein the voltage-current converter comprises first and second operational amplifiers (OP1, OP2) each having a negative input terminal to which the input signal is applied, a positive input terminal, and an output terminal, a first transistor (P101) that is connected to a power supply line and has a gate and a drain connected to the output terminal and the positive input terminal of the first operational amplifier, respectively, and a second transistor (P102) that is connected to the power supply line and has a gate and a drain connected to the output terminal and the positive input terminal of the second operational amplifier, respectively, wherein each of the inverters of the ring oscillator comprises a third transistor (P103) that is connected to the power supply line, and forms a current mirror circuit with the first transistor, and a fourth transistor (P104) that is connected in series with the third transistor and has a gate connected to the gate of the second transistor, the fourth transistor supplying current to other devices that constitute the each inverter, and wherein the first transistor, the third transistor and the fourth transistor have substantially the same device size, and the second transistor has a device size that is one-fourth of that of the first transistor.

In a second preferred embodiment of the present invention, the voltage-controlled oscillator comprises a ring oscillator comprising a plurality of inverters that are connected in a ring-like arrangement, and a voltage-current converter that controls an amount of current flowing through each of the inverters of the ring oscillator according to a voltage of an input signal, wherein the voltage-current converter comprises an operational amplifier having a negative input terminal to which the input signal is applied, a positive input terminal, and an output terminal, a first transistor (P101) that is connected to a power supply line, and has a gate and a drain connected to the output terminal and the positive input terminal of the operational amplifier, respectively, and a second transistor (P103') that is connected to the power supply line, wherein each of the inverters of the ring oscillator comprises a third transistor (P103) that is connected to the power supply line, and forms a current mirror circuit with the first transistor, and a fourth transistor (P104) that is connected in series with the third transistor, and has a gate connected to the gate of the second transistor, the fourth transistor (P104) supplying current to other devices that constitute the each inverter, and wherein the first transistor, the third transistor and the fourth transistor have substantially the same device size, and the second transistor has a device size that is one-fourth of that of the first transistor.

Preferably, in the second preferred embodiment further, the voltage-current converter further comprises a fifth transistor (P102') that has a gate connected to the gate of the first transistor and forms a second current mirror circuit with the first transistor, a sixth transistor (N101') that is diode-connected and connected in series with the fifth transistor, and a seventh transistor (N102') that is connected in series with the second transistor, and has a gate connected to the gate of the sixth transistor such that the sixth transistor and seventh transistor form a third current mirror circuit.

The above and other objects, features, and advantages of the invention will become more apparent from the following detailed description taken in conjunction with the accompanying drawings.

DETAILED DESCRIPTION OF THE PREFERRED EMBODIMENTS

Some preferred embodiments of the present invention will be described in detail with reference to the drawings.

Figure 1:
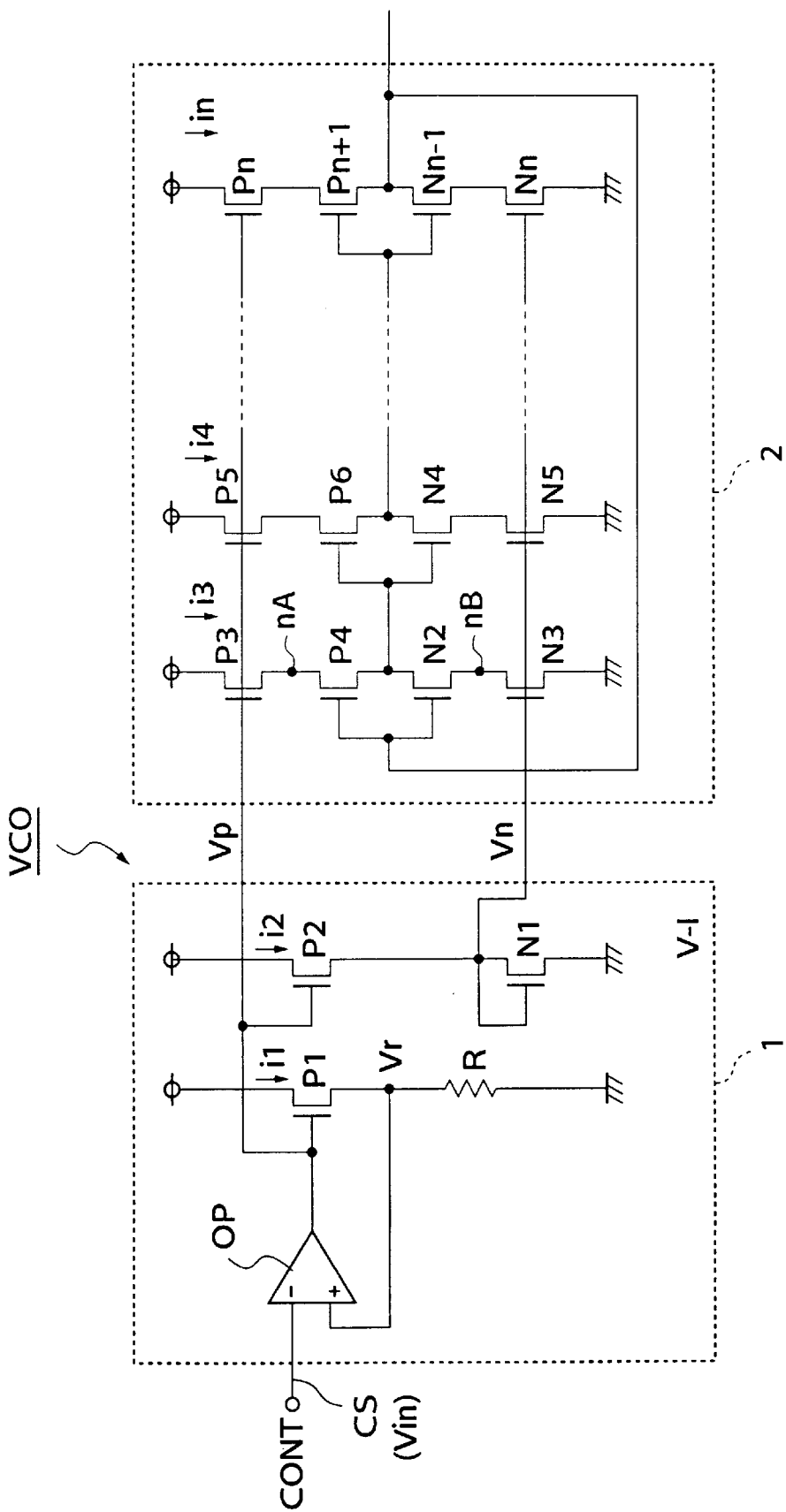
FIG. 1 is a circuit diagram showing the configuration of a known voltage-controlled oscillator.
Figure 2:
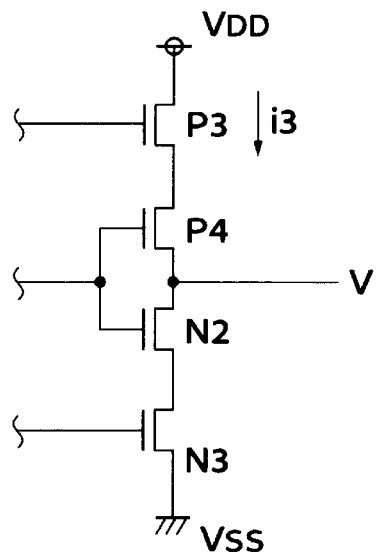
FIG. 2 is a circuit diagram showing the configuration of an inverter in the first stage of the known voltage-controlled oscillator of FIG. 1.
Figure 3:
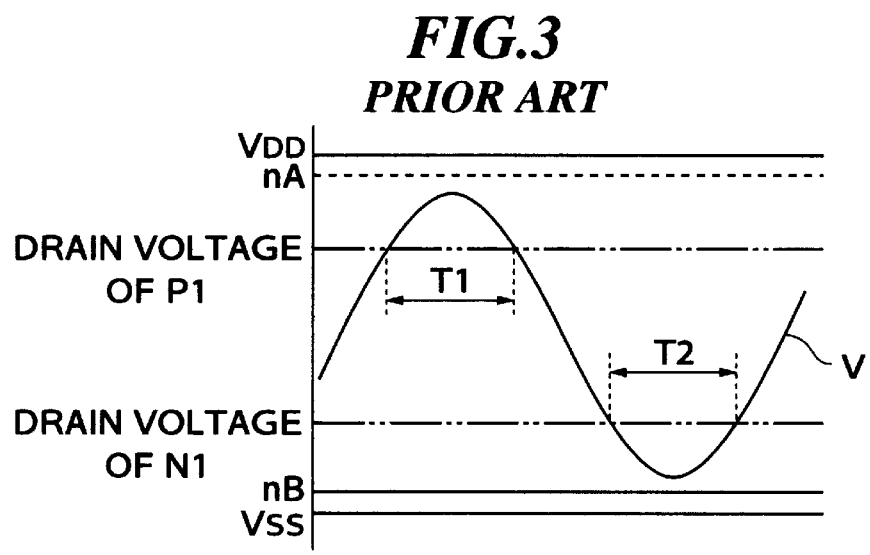
FIG. 3 is a view showing the waveform of a voltage signal associated with the known voltage-controlled oscillator.
Figure 4:
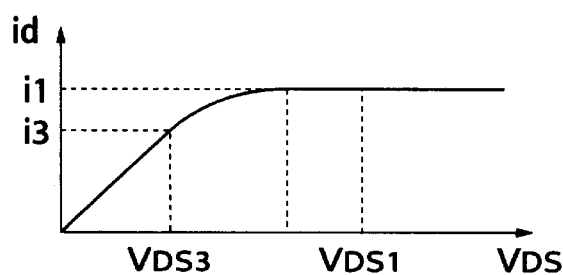
FIG. 4 is a graph showing a general relationship between the drain-source voltage VDS and the drain current id.
Figure 5:
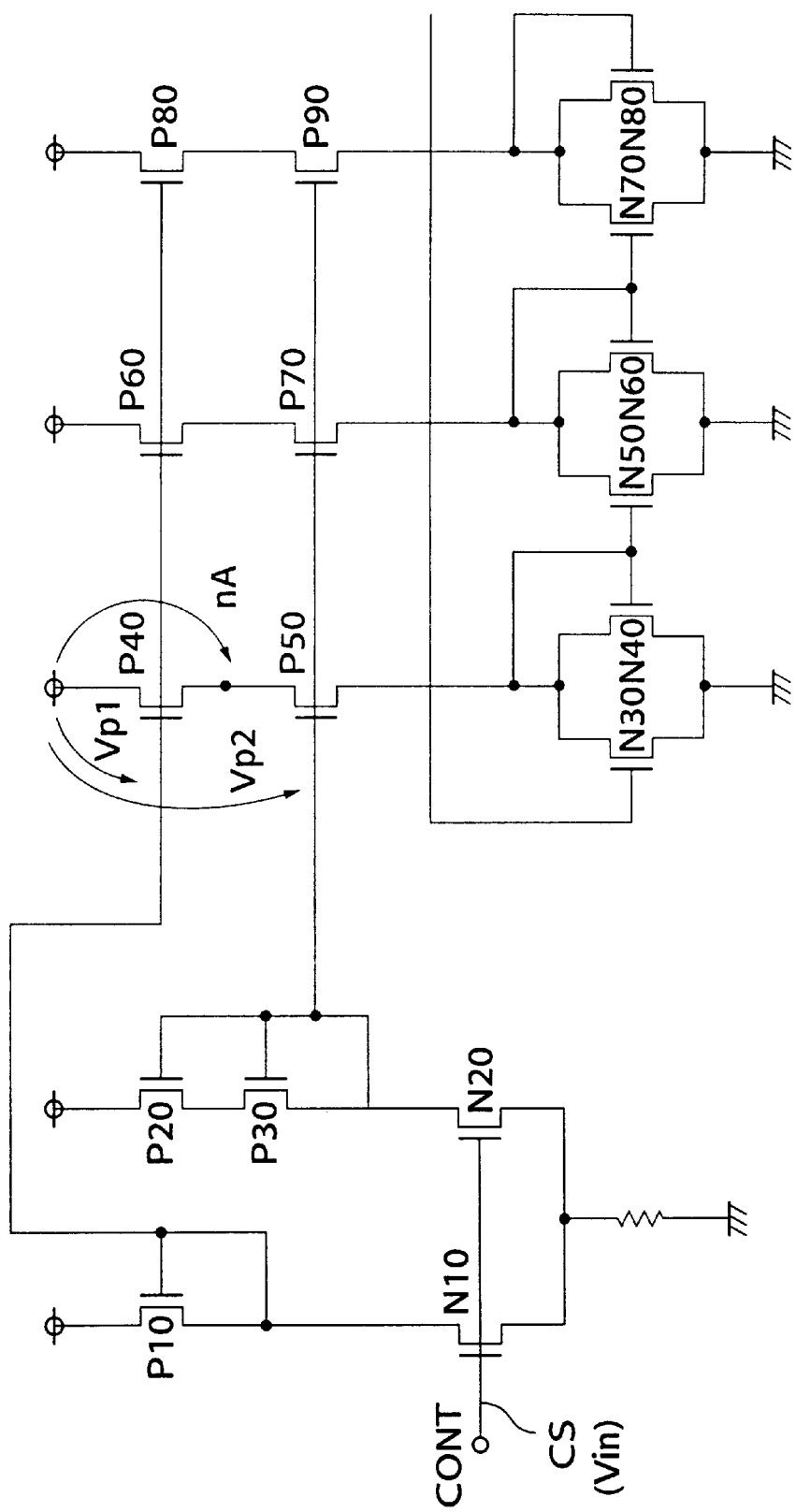
FIG. 5 is a circuit diagram showing the configuration of another known voltage-controlled oscillator.
Figure 6:
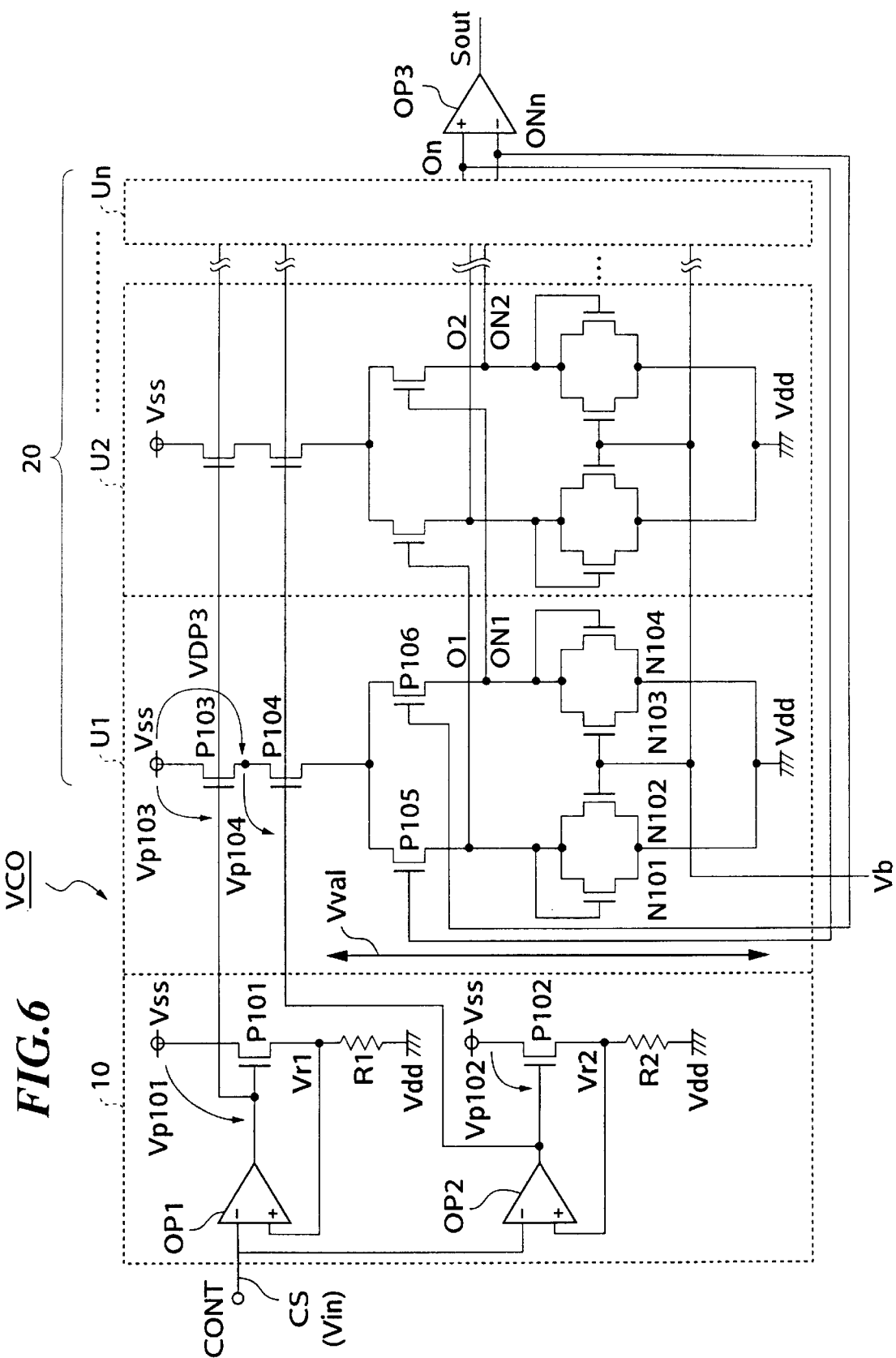
FIG. 6 is a circuit diagram showing the configuration of a voltage-controlled oscillator according to a first embodiment of the present invention.

FIG. 6 shows the configuration of a voltage-controlled oscillator according to one embodiment of the present invention. As shown in FIG. 6, the voltage-controlled oscillator VCO is principally comprised of a V-I converter portion 10, a ring oscillator portion 20 including n pieces of inverter units U1, U2, . . . Un connected in series, and an op amp OP3 that converts a differential input received from the ring oscillator portion 20 to generate an output oscillation signal Sout. In the following description, Vp101, Vp102 and Vp103 represent the voltage between the positive power supply voltage Vss (source) and the gate of the p-channel transistors P101–P103, respectively, Vp104 represents the voltage between the source and gate of the p-channel transistor P104, and VDP 103 represents the voltage between the source and drain of the p-channel transistor P103.

The V-I converter 10 serves to convert the voltage (Vin) of the control signal CS supplied to a control input terminal CONT, into corresponding current, and includes first and second op amps OP1, OP2. In the V-I converter 10, the drain of the p-channel transistor P101 is connected to the positive input terminal of the op amp OP1, and, similarly, the drain of the p-channel transistor P102 is connected to the positive input terminal of the op amp OP2. The control signal CS is supplied to the negative input terminals of the op amps OP1, OP2. In p-channel transistors, the phase of a signal taken at the gate is inverted with respect to that of a signal taken at the drain. With the arrangement as described above, therefore, negative feedback is applied to the op amps OP1, OP2. Namely, the drain voltages Vr1, Vr2 are applied in a feedback manner to the positive input terminals of the op amps OP1, Op2, respectively. As a result, the voltage Vin of the control signal CS and the drain voltage Vr1, Vr2 of each of the p-channel transistors P101, P102 become equal to each other.

In the present embodiment, the device size of the p-channel transistor P102 is set to be one-fourth (¼) of that of the p-channel transistor P101, and the value of a resistance R1 provided at the drain of the p-channel transistor P101 is set to be equal to that of a resistance R2 provided at the drain of the P channel transistor P102. Also, the dc level and amplitude of the input voltage Vi are determined so that the p-channel transistors P101, P102 operate all the time in the saturation region.

The inverter units U1, U2, . . . Un of the ring oscillator portion 20 have the same configuration or circuit arrangement with each other. Thus, the configuration of only the inverter unit U1 will be described herein. In the inverter unit U1, p-channel transistors P103, P104 are connected in series, and the gate of the transistor P103 is connected to the gate of the transistor P101 of the V-I converter 10, such that these transistors P101, P103 form a current mirror circuit. The gate of the transistor P104 is connected to the gate of the transistor P102 of the V-I converter 10. Also, the drain of the transistor P104 is connected to respective sources of p-channel transistors P105, 106 that constitute a differential (amplifier) circuit, and two pairs of n-channel transistors N101, N102 and N103, N104 serving as an active load are respectively provided at the drains of the p-channel transistors P105, 106. A bias voltage Vb is supplied from a constant voltage source (not shown) to the n-channel transistors N102 and N103. The device size of the transistors P103, P104 is set to be equal to that of the transistor P101.

In the voltage-controlled oscillator constructed as described above, when current corresponding to an input voltage Vin flows through each of the inverter units U1, U2, . . . Un, the inverter unit U1 first generates output signals O1 and ON1. The output signals O1, ON1 are then supplied to the inverter unit U2, which in turn inverts these signals O1, ON1 to generate output signals O2, ON2. In a similar manner, the output signals are propagated or transmitted through the inverter units Un, until the inverter unit Un in the last stage generates output signals On, ONn, and these signals On, ONn are then fed back to the inverter unit U1 in the first stage. Accordingly, the oscillation frequency f is determined by the delay time of each inverter unit U1, U2, . . . Un.

Next, the operation of the present embodiment will be explained.

When a control signal CS is supplied to the V-I converter 10, current corresponding to the voltage Vin flows through the p-channel transistors P101, P102. Since the device size of the transistor P101 is equal to that of the transistor P103 as described above, the following expression (3) is established:

$$Vp101 = Vp103 \qquad (3)$$

Also, current ip103 flowing through the transistor P103 is equal to current ip104 flowing through the transistor P104, and therefore the following expression (4) is established:

$$ip103 = ip104 \ldots \qquad (4)$$

Since all of the transistors operate in the saturation region, the above expression (4) may be converted into the following expression (5):

$$Idssp103\ (1-Vp103/Vtp103)^2 = Idssp104\ (1-Vp104/Vtp104)^2$$

$$(Idssp103/Vtp103^2)\ (Vp103-Vtp103)^2 = (Idssp104/Vtp104^2)\ (Vp104-Vtp104)^2$$

$$Kp103\ (Vp103-Vtp103)^2 = Kp104\ (Vp104-Vtp104)^2 \qquad (5)$$

where Vtp103 and Vtp104 denote pinch-off voltage of the transistors P103 and P104, respectively, and Idssp103 and Idssp104 denote drain current of the transistors P103 and P104, respectively, assumed when the voltage between the gate and source is 0V. Also, Kp103 and Kp104 are expressed as $Kp103 = Idssp103/Vtp103^2$, and $Kp104 = Idssp104/Vtp104^2$, respectively.

Here, the transistors P103, P104 are fabricated by the same manufacturing process, and therefore Kp103 is equal to Kp 104 (Kp103=Kp104), and Vtp103 is equal to Vtp104 (Vtp103=Vtp104). Thus, the following expression (6) can be derived from the above expression (5):

$$Vp103 = Vp104 \qquad (6)$$

Next, the voltages Vp101 and Vp102 between the source and gate of the p-channel transistors P101, P102 are respectively given by the following expressions (7) and (8):

$$Vp101 = Vtp101 + (ip101/Kp101)^{1/2} \qquad (7)$$

$$Vp102 = Vtp102 + (ip102/Kp102)^{1/2} \qquad (8)$$

Since the device size of the transistor P102 is one-fourth of that of the transistor P101 as described above, the above expression (8) may be converted into the following expression (9):

$$VP102 = Vtp101 + (4ip101/Kp101)^{1/2} \qquad (9)$$

The voltage VDP 103 between the source and drain of the p-channel transistor 103 is given by the following expression (10) that is derived from the above expressions (7) and (9):

$$\begin{aligned} VDP103 &= Vp102 - Vp101 \qquad (10)\\ &= (ip101/Kp101)^{1/2}\\ &= Vp101 - Vtp101 \end{aligned}$$

It follows that the p-channel transistor P103 operates at the boundary between the saturation region and the non-saturation region. It will be also understood from the above expression (10) that the source-drain voltage VDP103 depends on the pinch-off voltage Vtp101 of the p-channel transistor P101 that is determined by the operating temperature and the manufacturing process, and the source-gate voltage Vp101 of the p-channel transistor P101 that is determined by the input voltage Vin. Since the pinch-off voltage Vp101 can be set to be far smaller than the source-gate voltage Vp101, the resulting source-drain voltage VDP103 is hardly affected by fluctuations in the operating temperature or variations in the manufacturing process. Thus, the pinch-off voltage Vtp101 may be considered as a constant. Accordingly, current corresponding to the input voltage Vin can be caused to flow through the inverter unit U1.

Even in the case where VDP103>Vp101−Vtp101, the transistor P103 operates in the saturation region, and therefore the current flowing through the inverter unit U1 is the same as in the case where VDP103=Vp101−Vtp101. Thus, even where the transistors are designed so that VDP103>Vp101−Vtp101, the upper limit of the oscillation frequency f cannot be raised.

If the voltage VDP103 between the source and drain of the transistor P103 is increased, the ratio of the voltage VDP103 to the power supply voltage (Vss−Vdd) is accordingly increased, which means that the effective voltage Vval of the inverter as indicated in FIG. 6 is reduced. With the voltage Vval thus reduced, the output signal O1 given as a voltage divided by the p-channel transistor P105 and the n-channel transistors N101, N102 is accordingly reduced. If the source-drain voltage VDP103 increases excessively, therefore, the p-channel transistor of the inverter unit U2 that receives the accordingly reduced output signal O1 may not be kept in the ON state, which causes the ring oscillator to fail to oscillate. To ensure that the ring oscillator 20 performs a stable oscillating operation, the operating points of the other transistors P104–P106, N101–N104 of the inverter unit U1 need to be set to appropriate levels. Thus, the increase in the source-drain voltage VDP103 makes it necessary to set the power supply voltage (Vss−Vdd) to a sufficiently large value.

In the case where VDP103<Vp101−Vtp101, on the other hand, the transistor P103 operates in the non-saturation region, and current flowing through the inverter unit U1 is reduced compared to that in the case where VDP103= Vp101−Vtp101. Consequently, the upper limit of the oscillation frequency f is lowered.

If the transistors are designed so that VDP103=Vp101− Vtp101 as in the present embodiment, the ring oscillator 20 does not suffer from the above problems, and is able to operate with a low voltage assuring high stability. It is thus possible to provide a voltage-controlled oscillator that is most efficient or advantageous in terms of both of the oscillation frequency and the power supply voltage.

Figure 7:
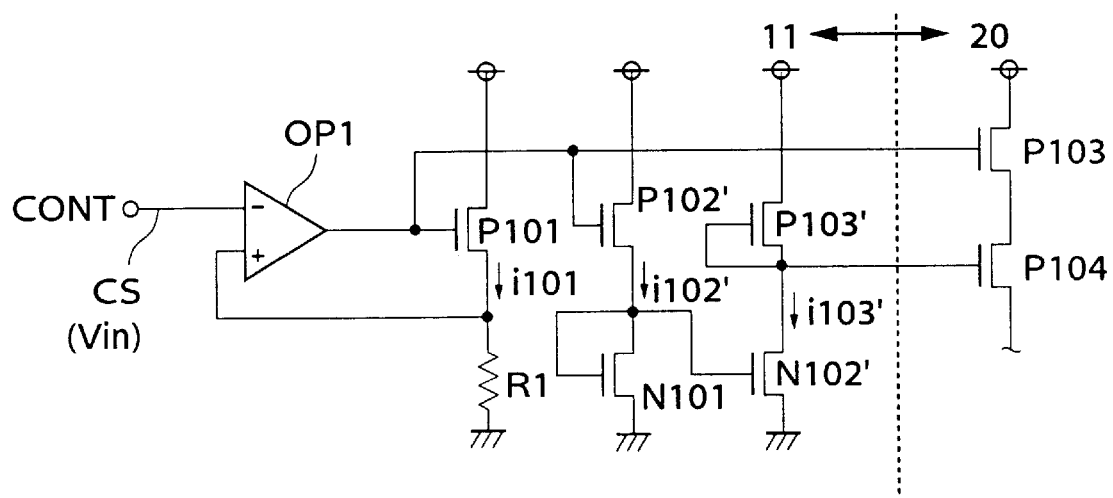
FIG. 7 is a circuit diagram showing the configuration of a voltage-controlled oscillator according to a second embodiment of the present invention.

Next, a second embodiment of the present invention will be described. The voltage-controlled oscillator VCO of the second embodiment has substantially the same configuration as that of the first embodiment except the use of a V-I converter 11 constructed by partially modifying the V-I converter 10 as used in the first embodiment. FIG. 7 shows the configuration of the voltage-controlled oscillator according to the second embodiment of the present invention. In FIG. 7, the same reference numerals as used in FIG. 6 are used to identify the corresponding components and parts, of which no detailed description will be provided.

The V-I converter 11 is different from the V-I converter 10 of the first embodiment in that the op amp OP2, p-channel transistor P102, and resistance R2 are eliminated, and replaced by p-channel transistors P102', P103' and n-channel transistors N101', N102'.

In the second embodiment, the gates of the p-channel transistors P102' and P103 are connected to the gate of the p-channel transistor P101 (namely, the p-channel transistors P101, P102' and P103 have a common gate), and thus these transistors P102', P103 and P101 constitute a current mirror circuit. The n-channel transistor N101' is connected in series with the p-channel transistor P102', and takes the form of a diode-connected transistor in which the gate and the drain are connected to each other. The p-channel transistor P103' also takes the form of a diode-connected transistor in which the gate and drain are connected to each other, and the n-channel transistor N102' is connected in series with the p-channel transistor P103'. The gate of the n-channel transistor N102' is connected to the gate of the n-channel transistor N101', so that these transistors N102' and N101' form a current mirror circuit.

In the present embodiment, the p-channel transistors P101, P102', P103 and P104 have the same device size, and the device size of the p-channel transistor P103' is set to be one-fourth of that of the p-channel transistor P101. Also, the device size of the n-channel transistor N101' is set to be equal to that of the n-channel transistor N102'.

Under the condition that the p-channel transistors P101 and P102' have the same device size, current ip101 flowing through the transistor P101 is equal to current ip102' flowing through the transistor P102'. Also, under the condition that the n-channel transistors N101' and N102' have the same device size, the current ip102' is equal to current ip103' flowing through the p-channel transistor P103'.

Since the device size of the p-channel transistor P103' is one-fourth of that of the p-channel transistor P101, the voltage Vp103' between the source and gate of the transistor P103' is given by the following expression (11), similarly to the above expression (9):

$$Vp103'=Vtp101+(4ip101/Kp101)^{1/2} \quad (11)$$

Consequently, the voltage VDP3 between the source and drain of the p-channel transistor P103 is expressed as VDP=Vp101−Vtp101, similarly to the above expression (10). Thus, the upper limit of the oscillation frequency can be raised, and the resulting voltage-controlled oscillator VCO is able to operate with a low voltage, assuring high operating stability.

The voltage-controlled oscillator VCO of the second embodiment is able to provide the same effects as provided by the first embodiment with a more simplified structure, due to the use of the V-I converter 11 that does not include the op amp OP2.

While the preferred embodiments of the invention have been described above for illustrative purpose only, it is to be understood that the present invention is not limited to these embodiments, but may be otherwise embodied with various changes or modifications as described below.

(1) In the illustrated embodiments, the device size of the p-channel transistor P102 or P103' is set to be one-fourth of that of the p-channel transistor P101 to establish the gate voltage of the p-channel transistor P104 so that the p-channel transistor 103 operates at the boundary between the saturation region and the non-saturation region. The present invention, however, is not limited to this arrangement, but may employ any other method of biasing the p-channel transistor P103 insofar as the transistor P103 operates at the boundary between the saturation region and the non-saturation region.

(2) In the illustrated embodiments, the p-channel transistors P101, P103 are used to provide a current mirror circuit, so as to control the current of each inverter. It is, however, possible to use n-channel transistors to provide a current mirror circuit. In this case, the voltage-controlled oscillators as shown in FIG. 6 and FIG. 7 may be modified such that the positive power supply line Vdd and the negative power supply line Vss are switched, and the p-channel transistors and n-channel transistors are replaced by each other.

As described above, the voltage-controlled oscillator constructed according to the present invention has excellent input and output characteristics that do not depend upon fluctuations or variations in the power supply voltage, operating temperature, and the manufacturing process, while assuring a sufficiently high oscillation frequency.

What is claimed is:

1. A voltage-controlled oscillator comprising:
a ring oscillator comprising a plurality of inverters that are connected in a ring-like arrangement;
a voltage-current converter that controls an amount of current flowing through each of the inverters of said ring oscillator according to a voltage of an input signal;
wherein said voltage-current converter comprises a first transistor (P101) that is connected to a power supply line and disposed such that current corresponding to the voltage of the input signal flows through the first transistor, each of the inverters of said ring oscillator having a second transistor (P103) that is connected to the power supply line and forms a current mirror circuit with the first transistor; and
biasing means for biasing said second transistor, said biasing means comprising a transistor having a device size thereof set to such a value relative to a device size of said first transistor and said second transistor such that the second transistor operates at a boundary between a saturation region and a non-saturation region.

2. A voltage-controlled oscillator comprising:
a ring oscillator comprising a plurality of inverters that are connected in a ring-like arrangement; and
a voltage-current converter that controls an amount of current flowing through each of the inverters of said ring oscillator according to a voltage of an input signal;
wherein said voltage-current converter comprises a first transistor (P101) and a second transistor (P102; P103') having a gate, each of the first transistor and the second transistor being connected to a power supply line and disposed such that current corresponding to the voltage of the input signal flows through each of the first transistor and the second transistor;
wherein each of the inverters of said ring oscillator comprises a third transistor (P103) that is connected to the power supply line, and forms a current mirror circuit with the first transistor, and a fourth transistor (P104) that is connected in series with the third transistor and has a gate connected to the gate of the second transistor, said fourth transistor supplying current to other devices that constitute said each inverter; and
wherein said first transistor, said third transistor and said fourth transistor have substantially the same device size, and said second transistor has a device size that is one-fourth of that of the first transistor.

3. A voltage-controlled oscillator comprising:
a ring oscillator comprising a plurality of inverters that are connected in a ring-like arrangement; and
a voltage-current converter that controls an amount of current flowing through each of the inverters of said ring oscillator according to a voltage of an input signal;
wherein said voltage-current converter comprises first and second operational amplifiers (OP1, OP2) each having a negative input terminal to which the input signal is applied, a positive input terminal, and an output terminal, a first transistor (P101) that is connected to a power supply line and has a gate and a drain connected to the output terminal and the positive input terminal of the first operational amplifier, respectively, and a second transistor (P102) that is connected to the power supply line and has a gate and a drain connected to the output terminal and the positive input terminal of the second operational amplifier, respectively;
wherein each of the inverters of said ring oscillator comprises a third transistor (P103) that is connected to the power supply line, and forms a current mirror circuit with the first transistor, and a fourth transistor (P104) that is connected in series with the third transistor and has a gate connected to the gate of the second transistor, said fourth transistor supplying current to other devices that constitute said each inverter; and
wherein said first transistor, said third transistor and said fourth transistor have substantially the same device size, and said second transistor has a device size that is one-fourth of that of the first transistor.

4. A voltage-controlled oscillator comprising:
a ring oscillator comprising a plurality of inverters that are connected in a ring-like arrangement; and
a voltage-current converter that controls an amount of current flowing through each of the inverters of said ring oscillator according to a voltage of an input signal;
wherein said voltage-current converter comprises an operational amplifier having a negative input terminal to which the input signal is applied, a positive input terminal, and an output terminal, a first transistor (P101) that is connected to a power supply line, and has a gate and a drain connected to the output terminal and the positive input terminal of said operational amplifier, respectively, and a second transistor (P103') that is connected to the power supply line;

wherein each of the inverters of said ring oscillator comprises a third transistor (P103) that is connected to the power supply line, and forms a current mirror circuit with the first transistor, and a fourth transistor (P104) that is connected in series with the third transistor, and has a gate connected to the gate of the second transistor, said fourth transistor (P104) supplying current to other devices that constitute said each inverter; and wherein said first transistor, said third transistor and said fourth transistor have substantially the same device size, and said second transistor has a device size that is one-fourth of that of the first transistor.

5. A voltage-controlled oscillator according to claim 4, wherein said voltage-current converter further comprises a fifth transistor (P102') that has a gate connected to the gate of said first transistor and forms a second current mirror circuit with the first transistor, a sixth transistor (N101') that is diode-connected and connected in series with the fifth transistor, and a seventh transistor (N102') that is connected in series with said second transistor, and has a gate connected to the gate of the sixth transistor such that the sixth transistor and seventh transistor form a third current mirror circuit.

* * * * *